United States Patent
Warmerdam et al.

[11] Patent Number: 6,008,881
[45] Date of Patent: Dec. 28, 1999

[54] MOTION DAMPER WITH ELECTRICAL AMPLIFIER, AND LITHOGRAPHIC DEVICE WITH SUCH A MOTION DAMPER

[75] Inventors: Thomas P. H. Warmerdam; Johan C. Compter; Franciscus M. Roes, all of Eindhoven, Netherlands

[73] Assignee: U.S. Philips Corporation, New York, N.Y.

[21] Appl. No.: 08/976,644

[22] Filed: Nov. 24, 1997

[30] Foreign Application Priority Data

Jun. 3, 1997 [EP] European Pat. Off. .............. 97201661

[51] Int. Cl.$^6$ .................................................. G03B 27/42
[52] U.S. Cl. .............................................. 355/53; 364/508
[58] Field of Search .............................. 324/125, 207.15, 324/207.24, 207.16; 355/72, 55; 188/378

[56] References Cited

U.S. PATENT DOCUMENTS

| | | | |
|---|---|---|---|
| 4,731,579 | 3/1988 | Petersen et al. | 324/207 |
| 4,841,184 | 6/1989 | Chen et al. | 310/90.5 |
| 4,864,238 | 9/1989 | Seitz | 324/253 |
| 5,445,249 | 8/1995 | Alda et al. | 188/378 |
| 5,493,216 | 2/1996 | Asa | 324/207.2 |
| 5,508,518 | 4/1996 | Kendall | 250/492.2 |
| 5,812,420 | 9/1998 | Takahashi | 364/508 |
| 5,841,275 | 11/1998 | Spies | 324/267.21 |

FOREIGN PATENT DOCUMENTS

0250031A1 12/1987 European Pat. Off. ........ G03B 41/00

*Primary Examiner*—Georgia Epps
*Assistant Examiner*—Tim Thompson

[57] ABSTRACT

A motion damper (1) with a first part (3) and a second part (5) which are mutually displaceable parallel to a damping direction (X). The first part (3) including a permanent magnet system (35), and the second part (5) including an electric actuator coil (25) which is positioned in the magnetic field of the magnet system (35). According to the invention, the motion damper (1) including an electrical amplifier (53) for amplifying an electric current generated in the actuator coil (25) under the influence of a movement of the actuator coil (25) in the magnetic field of the magnet system (35). Since the electric current is amplified, the interaction between the electric current and the magnetic field of the magnet system (35) provides a sufficient electromagnetic damping force with a substantially ideal linear damping characteristic. In a special embodiment, the motion damper including two substantially identical measuring coils (27, 29) which are arranged on either side of the actuator coil (25), and two mutually oppositely magnetized magnet systems (37, 39) for cooperating with the measuring coils (27, 29), while the amplifier (53) supplies the actuator coil (25) with a current which is proportional to a difference between the currents generated in the measuring coils (27, 29). The motion damper (1) is used in a lithographic device (57) for the manufacture of semiconductor substrates (75). The motion damper (1) serves to prevent vibrations of a plate (91) relative to a focusing unit (65) of the lithographic device (57), which plate (91) supports a position measuring system (87) of the lithographic device (57).

7 Claims, 3 Drawing Sheets

MOTION DAMPER WITH ELECTRICAL AMPLIFIER, AND LITHOGRAPHIC DEVICE WITH SUCH A MOTION DAMPER

DESCRIPTION

The invention relates to a motion damper with a first part and a second part which are displaceable relative to one another parallel to at least one damping direction, which first part is provided with means for providing a magnetic field and which second part is provided with an electrical conductor which is positioned in the magnetic field during operation and in which an electric current can be generated resulting from a mutual displacement of the first part and the second part parallel to the damping direction.

The invention also relates to a lithographic device provided with a radiation source, a mask holder, a focusing unit with a main axis, a positioning device with a substrate holder which is displaceable relative to the focusing unit parallel to an X-direction which is perpendicular to the main axis and parallel to a Y-direction which is perpendicular to the X-direction and perpendicular to the main axis, and a position measuring system for measuring a position occupied by the substrate holder with respect to the focusing unit parallel to the X-direction and parallel to the Y-direction, said focusing unit being fastened to a first holder, while the position measuring system is fastened to a second holder which is fastened to the first holder.

A motion damper of the kind mentioned in the opening paragraph is generally known and usual. When the first part and the second part of the motion damper are displaced relative to one another parallel to the damping direction during operation, an electric current is generated in the electrical conductor of the second part by the magnetic field of the first part. The interaction between the magnetic field of the first part and the electric current generated in the conductor of the second part cause the first part and the second part to exert mutual electromagnetic damping forces directed substantially parallel to the damping direction, owing to which the motion performed by the first part and the second part relative to one another parallel to the damping direction is damped. An advantage of the generally known motion damper is that there is no mechanical contact between the first part and the second part, so that so-called non-linear effects are avoided as much as possible in the generally known motion damper. Such non-linear effects occur, for example, in a viscous liquid damper in the case of vibrations of comparatively low amplitudes as a result of mechanical friction between the mutually movable parts of the liquid damper.

A disadvantage of the generally known motion damper is that the electromagnetic damping force of the motion damper is comparatively small, so that the generally known motion damper only has a comparatively weak damping action.

It is an object of the invention to provide a motion damper of the kind mentioned in the opening paragraph which provides a sufficient electromagnetic damping force.

According to the invention, the motion damper is for this purpose characterized in that the motion damper comprises an electrical amplifier for amplifying the electric current with a predetermined amplification factor. Since the motion damper according to the invention is provided with said electrical amplifier, the electric current flowing through the electrical conductor of the second part during operation is approximately equal to the product of the electric current which would be generated in the conductor without the use of the amplifier and said predetermined amplification factor. As a result, the electromagnetic damping force is also approximately equal to the product of the electromagnetic damping force which would arise without the use of the amplifier and said predetermined amplification factor. A sufficient amplification factor and a sufficient damping force are provided through the use of a suitable amplifier.

A special embodiment of a motion damper according to the invention is characterized in that the means for providing the magnetic field comprise a permanent magnet, while the electrical conductor comprises an electric coil. The use of the permanent magnet and the electric coil provides an electromagnetic damping force in a practical and effective manner such that it is substantially proportional to a speed which the first part and the second part of the motion damper have with respect to one another.

A further embodiment of a motion damper according to the invention is characterized in that the electric coil is an actuator coil, while the second part is provided with an electric measuring coil also positioned in the magnetic field during operation, said amplifier supplying the actuator coil during operation with an electric current which is substantially equal to the product of an electric current generated in the measuring coil and the predetermined amplification factor. In this further embodiment, the electric current generated in the measuring coil is measured in a manner which is usual and known per se. The use of said measuring coil and said actuator coil renders it possible to use a comparatively simple, conventional amplifier in this further embodiment of the motion damper.

A yet further embodiment of a motion damper according to the invention is characterized in that the second part comprises a plate-shaped carrier which extends parallel to the damping direction and on which the actuator coil and the measuring coil are positioned next to one another, as seen parallel to the damping direction, while the first part comprises a housing for accommodating the carrier, in which housing a first permanent magnet system for cooperation with the actuator coil and a second permanent magnet system for cooperation with the measuring coil are arranged. The use of said plate-shaped carrier and said housing provides a simple and compact modular build-up of the motion damper.

A special embodiment of a motion damper according to the invention is characterized in that the actuator coil and the measuring coil are each provided with oval windings which extend in a plane which is directed substantially parallel to the carrier and which form two winding halves which extend substantially perpendicular to the damping direction, while the magnet systems are each provided with a first pair of permanent magnets magnetized in an identical direction perpendicular to the carrier and arranged opposite one another on either side of the carrier for cooperation with one of the two winding halves of the actuator coil and of the measuring coil, respectively, and a second pair of permanent magnets magnetized in a direction opposed to the direction of the first pair and positioned opposite one another on either side of the carrier for cooperation with the other winding halves of the actuator coil and of the measuring coil, respectively. The use of said oval windings with the two winding halves extending substantially perpendicular to the damping direction and of said magnet systems with the two pairs of permanent magnets magnetized perpendicularly to the carrier result in the actuator coil and the measuring coil each having a comparatively high efficiency.

A further embodiment of a motion damper according to the invention is characterized in that the actuator coil is arranged, as seen parallel to the damping direction, between the measuring coil and a further measuring coil which is substantially identical to the measuring coil, while a third permanent magnet system is arranged in the housing for cooperation with the further measuring coil, which third permanent magnet system is provided with a first pair of permanent magnets positioned opposite one another on either side of the carrier for cooperation with one of the two winding halves of the further measuring coil, and a second pair of permanent magnets arranged opposite one another on either side of the carrier for cooperation with the other winding half of the further measuring coil, the first and the second pair of magnets of the third magnet system being arranged, as seen parallel to the damping direction, in a same sequence as the first and the second pair of magnets of the second magnet system and being magnetized in opposed directions with respect to the magnets of the second magnet system, while the amplifier during operation supplies the actuator coil with an electric current which is substantially equal to a product of a difference between the electric currents generated in the measuring coil and in the further measuring coil and the predetermined amplification factor. During operation, an electric current is generated in the measuring coil not only under the influence of the motion of the measuring coil in the magnetic field of the second permanent magnet system, but also an electric current under the influence of the electromagnetic field of the actuator coil. Since the measuring coil and said further measuring coil are positioned on either side of the actuator coil, substantially identical electric currents are generated in the measuring coil and the further measuring coil under the influence of the electromagnetic field of the actuator coil. Since the magnets of the third magnet system are magnetized in directions opposed to those of the magnets of the second magnet system, electric currents of equal value and having opposite directions are generated in the measuring coil and the further measuring coil under the influence of a movement in the magnetic field of the second and the third magnet system, respectively. The currents generated in the measuring coil and in the further measuring coil under the influence of the electromagnetic field of the actuator coil compensate one another because the amplifier supplies the actuator coil with an electric current which is proportional to the difference between the electric currents generated in the measuring coil and in the further measuring coil, so that the current through the actuator coil is proportional to the currents generated in the measuring coil and in the further measuring coil under the influence of a movement of the measuring coils relative to the first part.

A lithographic device of the kind mentioned in the second paragraph is known from EP-A-0 250 031. The known lithographic device is used in the manufacture of integrated semiconductor circuits by means of an optical lithographic process. The radiation source of the known lithographic device is a light source, while the focusing unit is an optical lens system by means of which a sub-pattern of an integrated semiconductor circuit, which pattern is present on a mask which can be placed on the mask holder of the lithographic device, is imaged on a reduced scale on a semiconductor substrate which can be placed on the substrate holder of the positioning device. Such a semiconductor substrate comprises a large number of fields on which identical semiconductor circuits are provided. The individual fields of the semiconductor substrate are consecutively exposed for this purpose, the semiconductor substrate being in a constant position relative to the mask and the focusing unit during the exposure of an individual field, while a next field of the semiconductor substrate is brought into position relative to the focusing unit by means of the positioning device between two consecutive exposure steps. This process is repeated a number of times, using a different mask with a different sub-pattern each time, so that integrated semiconductor circuits of comparatively complicated structure can be manufactured. The structure of such an integrated semiconductor circuit has detail dimensions which lie in the sub-micron range. The sub-patterns present on the consecutive masks should accordingly be imaged on said fields of the semiconductor substrate relative to one another with an accuracy which also lies in the sub-micron range. The semiconductor substrate, therefore, must be positioned relative to the mask and the focusing unit also with an accuracy lying in the sub-micron range by means of the positioning device. The position measuring system of the lithographic device should accordingly be fastened in an accurately defined position relative to the focusing unit. In the known lithographic device, the second holder, to which the position measuring system is fastened, is for this purpose fastened as rigidly as possible and substantially without damping to the first holder to which the focusing unit is fastened.

A disadvantage of the known lithographic device is that the second holder may be readily brought into resonance under the influence of interfering forces as a result of the rigid, undamped fastening to the first holder. Such a resonance of the second holder adversely affects the accuracy of the measurements carried out by the position measuring system.

According to the invention, the lithographic device is characterized in that the lithographic device is provided with a motion damper according to the invention, the first part of the motion damper being fastened to one of the two holders, and the second part of the motion damper being fastened to the other holder. The use of the motion damper according to the invention also damps comparatively strong resonances of the second holder as much as possible. Since the motion damper has a substantially linear character also in the case of vibrations of comparatively small amplitudes, an accurate damping of the vibrations is provided also in the case of such vibrations having small amplitudes.

The invention will be explained in more detail below with reference to the drawing, in which.

Figure 3:
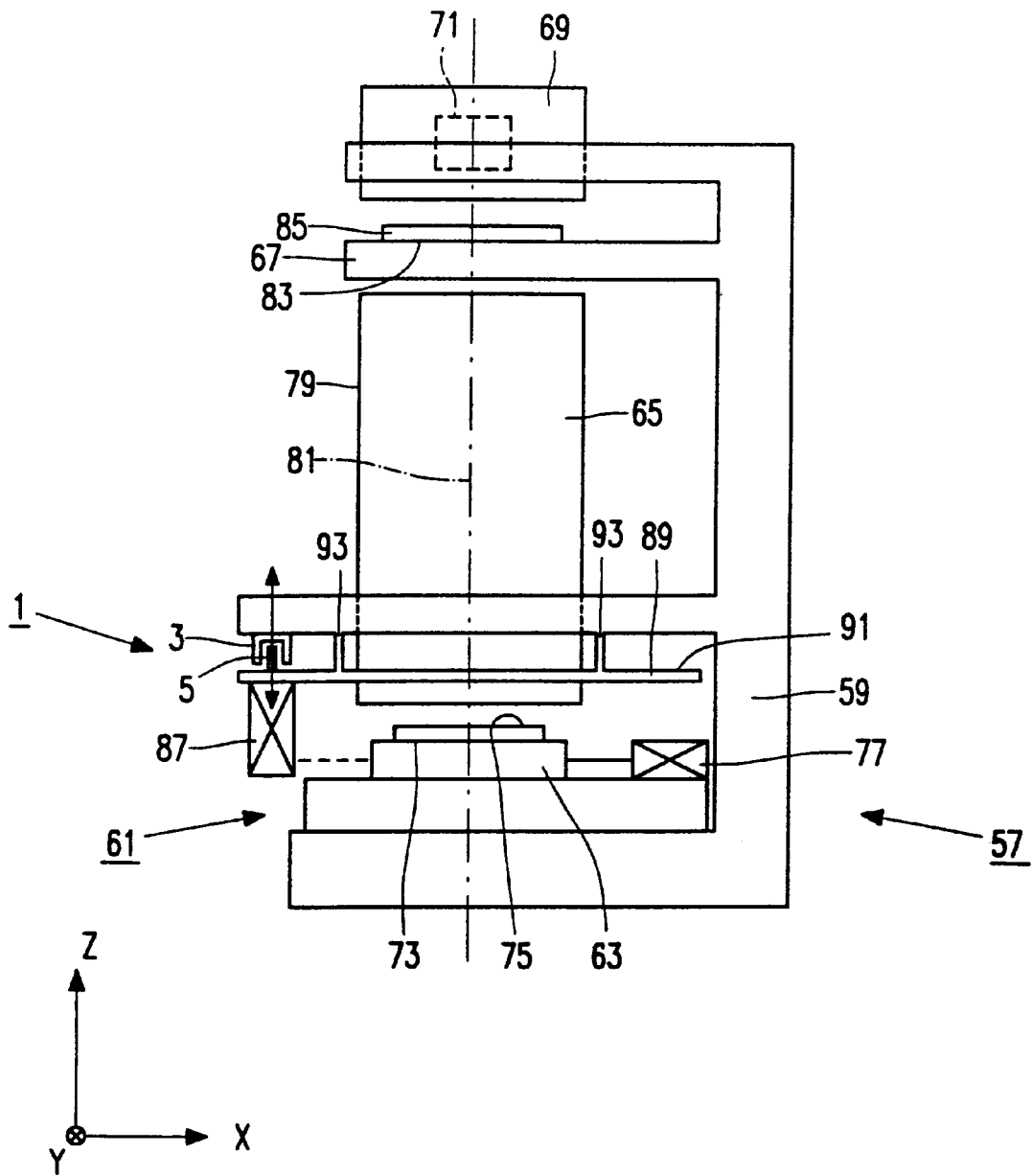

FIG. 3 diagrammatically shows a lithographic device according to the invention.

Figure 1:
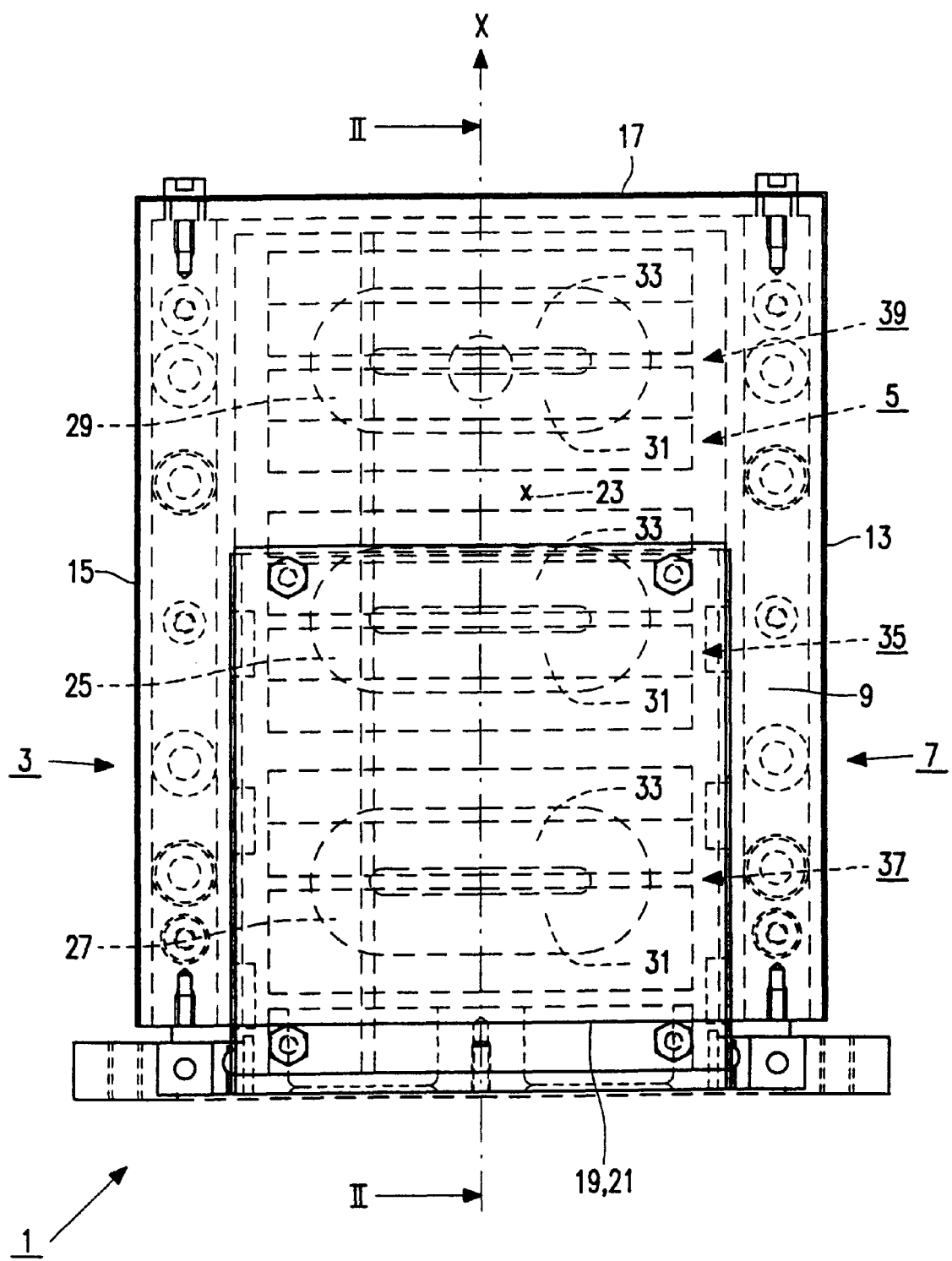
FIG. 1 shows a motion damper according to the invention.
Figure 2:
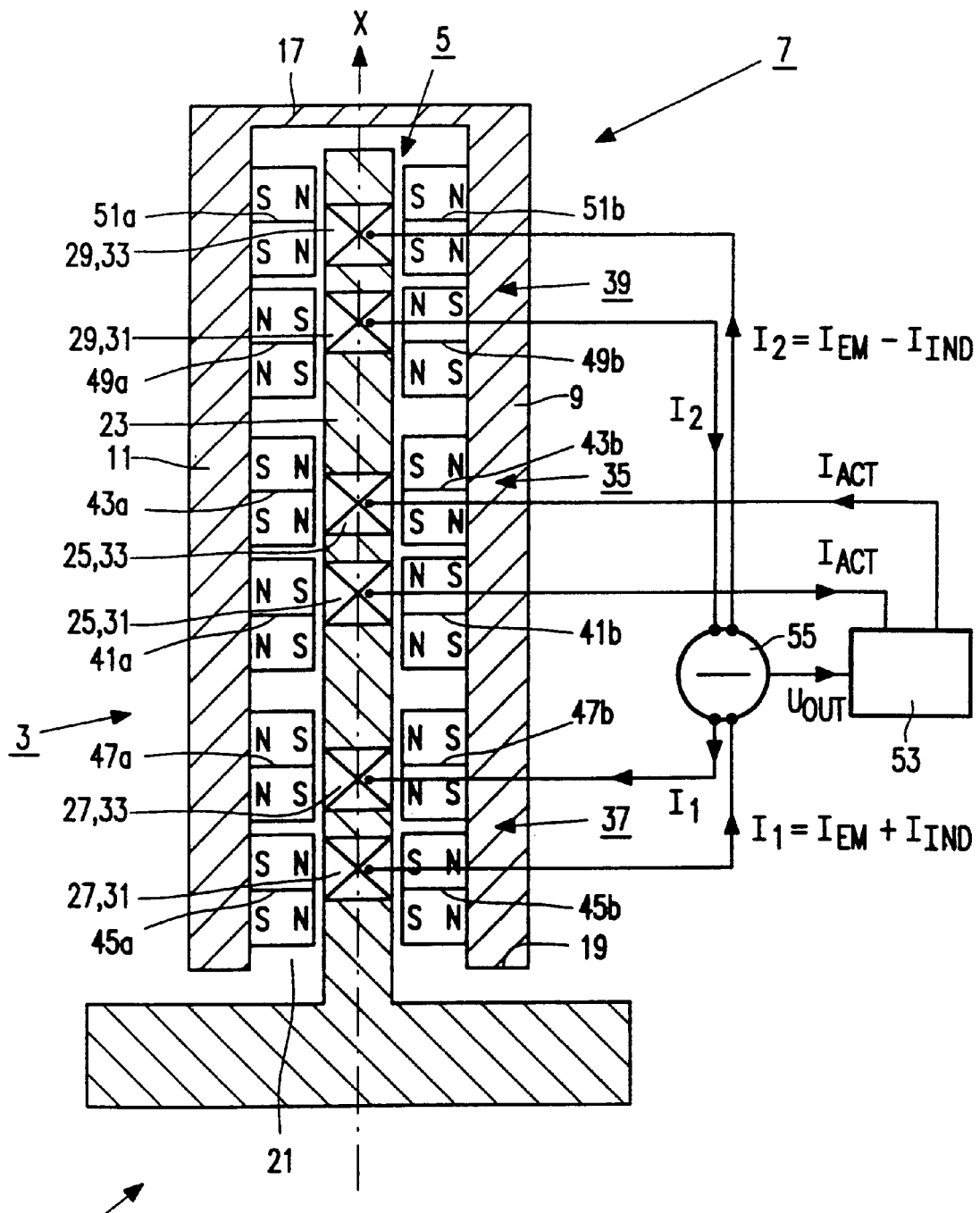
FIG. 2 is a cross-section taken on the line II—II in FIG. 1.

The motion damper 1 according to the invention shown in FIGS. 1 and 2 comprises a first part 3 and a second part 5 which are displaceable relative to one another parallel to a damping direction X. The motion damper 1 is suitable for damping motions performed by two bodies, which are not shown in FIGS. 1 and 2, relative to one another parallel to the damping direction X, the first part 3 being suitable for fastening to one of said two bodies and the second part 5 being suitable for fastening to the other body. The first part 3 comprises a housing 7 which has two main walls 9 and 11 directed parallel to the damping direction X, two side walls 13 and 15 directed parallel to the damping direction X, and an end wall 17 directed perpendicular to the damping direction X. At a side 19 present opposite the end wall 17, the housing 7 has an opening 21 through which the second part 5 can be inserted into the housing 7. The second part 5 comprises a plate-shaped carrier 23 which extends substantially parallel to the main walls 9 and 11 of the first part 3 when the second part 5 has been placed in the first part 3.

As FIGS. 1 and 2 show, a centrally placed electric actuator coil 25, an electric measuring coil 27, and a further electric measuring coil 29 are provided in the carrier 23, said measuring coil 27 and further measuring coil 29 being substantially identical and being arranged on either side of the actuator coil 25 seen in the damping direction X. As FIG. 1 shows, the actuator coil 25, the measuring coil 27, and the further measuring coil 29 are each provided with oval windings which extend in a plane substantially parallel to the carrier 23, while the actuator coil 25, the measuring coil 27, and the further measuring coil 29 each comprise two winding halves 31, 33 which extend substantially perpendicular to the damping direction X. As FIGS. 1 and 2 further show, a first permanent magnet system 35 for cooperation with the actuator coil 25, a second permanent magnet system 37 for cooperation with the measuring coil 27, and a third permanent magnet system 39 for cooperation with the further measuring coil 29 are provided in the housing 7. As FIG. 2 shows, the first magnet system 35 comprises a first pair of permanent magnets 41a, 41b which are positioned opposite one another on either side of the carrier 23 for cooperation with the winding half 31 of the actuator coil 25, and a second pair of permanent magnets 43a, 43b which are positioned opposite one another on either side of the carrier 23 for cooperation with the winding half 33 of the actuator coil 25. The magnets 41a, 41b are magnetized in the same direction perpendicular to the carrier 23, whereas the magnets 43a, 43b are magnetized in directions opposed to the direction of the magnets 41a, 41b. Similarly, the second magnet system 37 comprises a first pair of permanent magnets 45a, 45b which are arranged opposite one another on either side of the carrier 23 for cooperation with the winding half 31 of the measuring coil 27, and a second pair of permanent magnets 47a, 47b which are arranged opposite one another on either side of the carrier 23 for cooperation with the winding half 33 of the measuring coil 27. The magnets 45a, 45b are magnetized in the same direction perpendicular to the carrier 23, and the magnets 47a, 47b are magnetized in directions opposed to the direction of the magnets 45a, 45b. Finally, the third magnet system 39 comprises a first pair of permanent magnets 49a, 49b which are arranged opposite one another on either side of the carrier 23 for cooperation with the winding half 31 of the further measuring coil 29, and a second pair of permanent magnets 51a, 51b which are arranged opposite one another on either side of the carrier 23 for cooperation with the winding half 33 of the further measuring coil 29. As FIG. 2 shows, the first pair of magnets 49a, 49b and the second pair of magnets 51a, 51b of the third magnet system 39 are arranged in the same sequence seen in the damping direction X as the first pair of magnets 45a, 45b and the second pair of magnets 47a, 47b of the second magnet system 37, the magnets 49a, 49b being magnetized in a direction opposed to the direction of the magnets 45a, 45b, and the magnets 51a, 51b being magnetized in a direction opposed to the direction of the magnets 47a, 47b.

The actuator coil 25 is used for generating an electromagnetic damping force in a manner to be described below. The actuator coil 25 is for this purpose supplied with an electric current $I_{ACT}$ during operation in a manner to be described below by means of an electrical amplifier 53 of the motion damper 1 which is diagrammatically depicted in FIG. 2 and which is usual and known per se.

When the first part 3 and the second part 5 of the motion damper 1 are displaced relative to one another parallel to the damping direction X during operation, electric currents are generated in the measuring coil 27 and in the further measuring coil 29 by the magnetic fields of the second magnet system 37 and the third magnet system 39, respectively. Since the measuring coil 27 and the further measuring coil 29 are substantially identical, and the second magnet system 37 and the third magnet system 39 are also substantially identical, as described above, but are magnetized in opposite directions, an electric current $+I_{IND}$ and an electric current $-I_{IND}$ having the same value but opposed directions are generated in the measuring coil 27 and in the further measuring coil 29, respectively, under the influence of a movement of the second part 5 relative to the first part 3. Said electric currents $+I_{IND}$ and $-I_{IND}$ are substantially proportional to a speed which the first part 3 and the second part 5 have with respect to one another parallel to the damping direction X. Apart from said electric currents $+I_{IND}$ and $-I_{IND}$, electric currents $I_{EM}$ are generated in the measuring coil 27 and in the further measuring coil 29 owing to an electromagnetic field generated by the actuator coil 25. Said electric currents $I_{EM}$ in the measuring coil 27 and in the further measuring coil 29 have the same value and the same direction. Thus the total electric current $I_1$ in the measuring coil 27 during operation is equal to $I_{EM}+I_{IND}$, whereas the total electric current $I_2$ in the further measuring coil 29 is equal to $I_{EM}-I_{IND}$. The total currents $I_1$ and $I_2$ are diagrammatically shown in FIG. 2.

As FIG. 2 further shows, the motion damper 1 comprises an electric subtracter circuit 55 with electric inputs for the currents $I_1$ and $I_2$ as mentioned above. The subtracter circuit 55 supplies an output signal $u_{OUT}$ which is proportional to a difference $I_1-I_2=2*I_{IND}$ of the currents $I_1$ and $I_2$. Thus the output signal $u_{OUT}$ is proportional to the value of the current $I_{IND}$ which, as discussed above, is proportional to the speed which the first part 3 and the second part 5 have with respect to one another. The output signal $u_{OUT}$ is independent of the value of the current $I_{EM}$ generated by the actuator coil 25. The currents $I_{EM}$ generated in the measuring coils 27 and 29 are thus mutually compensated through the use of the magnet systems 37 and 39 magnetized in opposite directions and the subtracter circuit 55.

According to the invention, the current $I_{ACT}$ with which the actuator coil 25 is supplied by the amplifier 53 is equal to the product of the output signal $u_{OUT}$ and a predetermined amplification factor K. The amplifier 53 thus amplifies the current $I_{IND}$ generated in the measuring coils 27 and 29 under the influence of the movement of the first part 3 and the second part 5 with respect to one another by the amplification factor K. Owing to the interaction between the magnetic field of the first magnet system 35 and the electric current $I_{ACT}$ in the actuator coil 25, the first part 3 and the second part 5 exert on one another an electromagnetic damping force directed substantially parallel to the damping direction X, under the influence of which the movement carried out by the first part 3 and the second part 5 with respect to one another parallel to the damping direction X is damped. Since the damping force is substantially proportional to the value of the current $I_{ACT}$, the current $I_{ACT}$ is substantially proportional to the current $I_{IND}$, and the current $I_{IND}$ is substantially proportional to the speed of the first part 3 and the second part 5 with respect to one another, it follows that the damping force of the motion damper 1 is substantially proportional to the speed of the first part 3 and the second part 5 with respect to one another. A substantially ideal linear damping characteristic of the motion damper 1 is provided thereby.

By giving the amplifier 53 a sufficient amplification factor K, it is achieved that the motion damper 1 has a sufficient damping force. The achievable damping force is considerably greater than the damping force which arises owing to the interaction between the currents generated in the measuring coils 27 and 29 and the magnetic fields of the magnet systems 37 and 39. The damping force provided by the latter interaction is insufficient for most applications. Since there is no mechanical contact between the first part 3 and the second part 5, no friction will occur between the first part 3 and the second part 5. It is achieved thereby that the substantially ideal linear damping characteristic mentioned above is not disturbed by so-called non-linear effects caused by frictional forces between the first part 3 and the second part 5. In particular, said linear damping characteristic is also present in the case of comparatively small mutual motions of the first part 3 and the second part 5, such as vibrations having a small amplitude. It is noted that it is not necessary for the predetermined amplification factor K to have a constant value. The predetermined amplification factor K may have a value, for example, which is dependent on the frequency of the movement of the first part 3 and the second part 5 relative to one another.

The construction of the motion damper 1 with the housing 7 and the plate-shaped carrier 23 as described above provides a particularly simple, compact modular arrangement of the motion damper 1. As a result, the motion damper 1 can be incorporated in a comparatively simple manner into a device in which the mutual movements of two bodies are to be damped. The amplifier 53 and the required electrical and/or electronic components of the motion damper 1 may be integrated into, for example, the housing 7 in a simple manner. The actuator coil 25 and the measuring coils 27 and 29 have a high efficiency owing to the use of the winding halves 31, 33 described above which extend substantially perpendicular to the damping direction X and the magnet systems 35, 37 and 39 described above with the permanent magnets arranged on either side of the carrier 23, while the actuator coil 25 provides a damping force which is directed substantially parallel to the damping direction X.

It is noted that the motion damper according to the invention may alternatively be provided with only a single measuring coil, while the amplifier supplies the actuator coil during operation with an electric current which is substantially equal to the product of the electric current generated in the measuring coil and the amplification factor K. Since the electric current through the measuring coil also comprises a component generated by the electromagnetic field of the actuator coil, a crosstalk will arise between the actuator coil and the measuring coil whereby the achievable amplification is limited. Such a crosstalk, however, may be admissible if the component of the current in the measuring coil generated by the field of the actuator coil is comparatively small, for example because there is a comparatively great distance between the actuator coil and the measuring coil.

It is further noted that the motion damper according to the invention may alternatively comprise an actuator coil without measuring coils. In such an embodiment, the electrical amplifier comprises, for example, an electric circuit which is usual and known per se and with which the electrical resistance and/or the self-inductance of the actuator coil is reduced by electronic means, so that a sufficient electric current can be generated in the actuator coil under the influence of movements of the actuator coil in the magnetic field of the first part of the motion damper. Since the current generated in the actuator coil in this manner is substantially proportional to the mutual speeds of the first part and the second part of the motion damper, an ideal linear damping characteristic is again achieved in such an embodiment of the motion damper.

It is further noted that the invention also relates to motion dampers by means of which a damping force is provided in more than one damping direction. Thus, for example, a motion damper is provided for generating damping forces parallel to a first damping direction X and parallel to a second damping direction Y perpendicular to the first damping direction X in that a second actuator coil with associated measuring coils is provided on the carrier 23 of the motion damper 1 for the second damping direction Y, and further magnet systems are mounted in the housing 7 for cooperation with the second actuator coil and the associated measuring coils.

It is also noted that a motion damper according to the invention may be provided, not with the permanent magnet system 35 and the actuator coil 25 cooperating therewith as described before, but with alternative means which are usual and known per se for providing a magnetic field and with an alternative closed electrical conductor which is usual and known per se, which is positioned in the magnetic field during operation, and in which an electric current can be generated as a result of a mutual displacement of the first part and the second part parallel to the damping direction. Thus the means for providing the magnetic field may comprise, for example, an electromagnetic coil, and the closed electrical conductor may comprise, for example, a closed strip-shaped or plate-shaped conductor.

FIG. 3 diagrammatically shows a lithographic device 57 according to the invention in which a motion damper 1 according to the invention is used. The lithographic device 57 is used for the manufacture of integrated semiconductor circuits by an optical lithographic process utilizing an imaging method which follows the so-called "step and repeat" principle. As FIG. 3 diagrammatically shows, the lithographic device 57 is provided with a first holder 59 which supports in that order, seen parallel to a vertical Z-direction, a positioning device 61 with a movable substrate holder 63, a focusing unit 65, a mask holder 67, and a radiation source 69. The lithographic device 57 is an optical lithographic device, the radiation source 69 comprising a light source 71. The substrate holder 63 comprises a support surface 73, which extends perpendicular to the Z-direction and on which a semiconductor substrate 75 can be placed, and is displaceable relative to the focusing unit 65 by means of a displacement unit 77 of the positioning device 61 parallel to an X-direction directed perpendicular to the Z-direction and parallel to a Y-direction directed perpendicular to the X-direction and perpendicular to the Z-direction. The focusing unit 65 is an imaging or projection system and comprises an optical lens system 79 with an optical main axis 81 directed parallel to the Z-direction and an optical reduction factor which is, for example, 4 or 5. The mask holder 67 comprises a support surface 83 which extends perpendicular to the Z-direction and on which a mask 85 can be placed. The mask 85 comprises a pattern or a sub-pattern of an integrated semiconductor circuit. During operation, a light beam originating from the light source 71 is guided through the mask 85 and focused on the semiconductor substrate 75 by means of the lens system 79, so that the pattern present on the mask 85 is imaged on a reduced scale on the semiconductor substrate 75. The semiconductor substrate 75 comprises a large number of individual fields on which identical semiconductor circuits are provided. The fields of the semiconductor substrate 75 are consecutively exposed through the mask 85 for this purpose. During the exposure of an individual field of the semiconductor substrate 75, the semiconductor substrate 75 and the mask 85 are in fixed positions relative to the focusing unit 65, whereas a next field is brought into position relative to the focusing unit 65 each time after the exposure of an individual field in that the substrate holder 63 is displaced by means of the displacement unit 77 parallel to the X-direction and/or parallel to the Y-direction. This process is repeated a number of times, with a different mask each time, so that complicated integrated semiconductor circuits with layered structures can be manufactured. The integrated semiconductor circuits to be manufactured by means of the lithographic device have a structure with detail dimensions which lie in the sub-micron range. Since the semiconductor substrate 75 is exposed through a number of different consecutive masks, the patterns present on the masks should be imaged on the semiconductor substrate 75 consecutively with an accuracy which also lies in the sub-micron, or even the nanometer range. The semiconductor substrate 75, therefore, must be positioned relative to the focusing unit 65 with a similar accuracy between two consecutive exposure steps, which means that very high requirements are imposed on the positioning accuracy of the positioning device 61.

As FIG. 3 diagrammatically shows, furthermore, the lithographic device 57 is provided with a position measuring system 87 for measuring a position occupied by the substrate holder 63 relative to the focusing unit 65, as seen parallel to the X-direction and parallel to the Y-direction. The position measuring system 87, which comprises, for example, a laser interferometer which is usual and known per se, cooperates with a control unit (not shown in FIG. 3) of the lithographic device 57 which controls the displacement unit 77. The position measuring system 87 is fastened to a second holder 89 which is fastened to the first holder 59. Because of the very stringent requirements imposed on the positioning accuracy of the positioning device 61, the position measuring system 87 must be fastened in an accurate position with respect to the focusing unit 65. The second holder 89 of the lithographic device 57 is for this purpose fastened to the first holder 59 as rigidly as possible and substantially without damping. The fact that the second holder 89 is fastened to the first holder 59 as rigidly as possible and substantially without damping means that, without further measures being taken, the second holder 89 may be easily brought into resonance under the influence of, for example, mechanical vibrations which are transmitted from the first holder 59 to the second holder 89 and which are caused by internal and external interfering forces exerted on the first holder 59. Such resonances of the second holder 89 adversely affect the accuracy with which the position of the position measuring system 87 is defined in relation to the focusing unit 65, and accordingly also the accuracy of the measurements carried out by the position measuring system 87.

To prevent Such resonances of the second holder 89 as much as possible, the lithographic device 57 according to the invention is provided with a motion damper 1 according to the invention which is shown diagrammatically only in FIG. 3. The first part 3 of the motion damper 1 is fastened to the first holder 59, and the second part 5 of the motion damper 1 is fastened to the second holder 89. As FIG. 3 diagrammatically shows, the motion damper 1 is fastened to the lithographic device 57 such that the motion damper 1 supplies a damping force which is directed substantially parallel to the Z-direction. As FIG. 3 shows, the second holder 89 comprises a plate 91 which extends perpendicular to the Z-direction and which is fastened to the first holder 59 close to the focusing unit 65 by means of a limited number of fastening points 93, for example three such points. Such a plate 91 resonates mainly in a direction parallel to the Z-direction, so that said resonances are counteracted as effectively as possible by the arrangement of the motion damper 1 as mentioned above. Since comparatively great damping forces can be generated by means of the motion damper 1 according to the invention, comparatively strong resonances of the second holder 89 are also prevented as much as possible. Comparatively weak resonances of the second holder 89 are also accurately damped because the motion damper 1 according to the invention has a substantially linear damping characteristic also for vibrations of comparatively small amplitudes. The use of the motion damper 1 thus leads to an increase in the accuracy of the position measuring system 87, so that also the positioning accuracy of the positioning device 61 is improved.

FIG. 3 shows only one motion damper 1 which is arranged close to the position measuring system 87. It is noted that the lithographic device 57 according to the invention may alternatively be provided with more than one motion damper 1. If the position measuring system 87 comprises, for example, more than one position sensor, a separate motion damper 1 may be positioned adjacent each individual position sensor of the position measuring system 87. It is in addition possible, for example, to use one or several motion dampers 1 for preventing vibrations of the second holder 89 relative to the focusing unit 65 which are directed parallel to the X-direction and/or parallel to the Y-direction.

It is further noted that the lithographic device 57 according to the invention may be provided with a further positioning device with a mask holder which is displaceable parallel to the X-direction instead of the mask holder 67. In this embodiment of the lithographic device according to the invention, in which an imaging method following the so-called "step and scan" principle is used, the semiconductor substrate 75 under manufacture is not in a constant position relative to the mask 85 and the focusing unit 65 during the exposure of an individual field of the semiconductor substrate 75, but instead the semiconductor substrate 75 and the mask 85 are synchronously displaced relative to the focusing unit 65 parallel to the X-direction by means of the positioning device 61 of the substrate holder 63 and the further positioning device of the mask holder, respectively, during the exposure. In this manner, the pattern present on the mask 85 is scanned parallel to the X-direction and synchronously imaged on the semiconductor substrate 75. It is achieved thereby that a maximum surface area of the mask 85 which can be imaged on the semiconductor substrate 75 through the focusing unit 65 is limited to a lesser extent by a size of an aperture of the focusing unit 65. Since the detail dimensions of the integrated semiconductor circuits to be manufactured lie in the sub-micron range, the semiconductor substrate 75 and the mask 85 must be displaced with an accuracy also in the sub-micron range relative to the focusing unit 65 during the exposure. In this embodiment of the lithographic device, the position measuring system 87 also measures a position occupied by the mask holder relative to the focusing unit 65 parallel to the X-direction. The position sensors of the position measuring system 87 which measure said position of the mask holder are fastened, for example, to a further holder which is fastened as rigidly as possible to the first holer 59. To prevent undesirable resonances of the further holder, the further holder may be coupled to the first holder 59 in the same manner as the second holder 89 mentioned above by means of one or several motion dampers 1 according to the invention.

It is finally noted that a motion damper according to the invention may be used not only in a lithographic device such as described above but also in other devices in which mutual movements or vibrations of two bodies in one or several directions are to be prevented. Examples of this are accurate machine tools or accurate measuring instruments.

We claim:

1. A motion damper with a first part and a second part which are displaceable relative to one another parallel to at least one damping direction, which first part is provided with means for providing a magnetic field and which second part is provided with an electrical conductor which is positioned in the magnetic field during operation and in which an electric current is generated in the electrical conductor by a mutual displacement of the first part and the second part, parallel to the damping direction, the electrical current being proportional to a speed at which the first part and the second part are displaced relative to one another, wherein the motion damper comprises an electrical amplifier for amplifying the electric current with a predetermined amplification factor.

2. A motion damper as claimed in claim 1, wherein the means for providing the magnetic field comprise a permanent magnet, while the electrical conductor comprises an electric coil.

3. A motion damper as claimed in claim 2, wherein the electric coil is an actuator coil, while the second part is provided with an electric measuring coil also positioned in the magnetic field during operation, said amplifier supplying the actuator coil during operation with an electric current which is substantially equal to the product of an electric current generated in the measuring coil and the predetermined amplification factor.

4. A motion damper as claimed in claim 3, wherein the second part comprises a plate-shaped carrier which extends parallel to the damping direction and on which the actuator coil and the measuring coil are positioned next to one another, as seen parallel to the damping direction, while the first part comprises a housing for accommodating the carrier, in which housing a first permanent magnet system for cooperation with the actuator coil and a second permanent magnet system for cooperation with the measuring coil are arranged.

5. A motion damper as claimed in claim 4, wherein the actuator coil and the measuring coil are each provided with oval windings which extend in a plane which is directed substantially parallel to the carrier and which form two winding halves which extend substantially perpendicular to the damping direction, while the magnet systems are each provided with a first pair of permanent magnets magnetized in an identical direction perpendicular to the carrier and arranged opposite one another on either side of the carrier for cooperation with one of the two winding halves of the actuator coil and of the measuring coil, respectively, and a second pair of permanent magnets magnetized in a direction opposed to the direction of the first pair and positioned opposite one another on either side of the carrier for cooperation with the other winding halves of the actuator coil and of the measuring coil, respectively.

6. A motion damper as claimed in claim 5, wherein the actuator coil is arranged, as seen parallel to the damping direction, between the measuring coil and a further measuring coil which is substantially identical to the measuring coil, while a third permanent magnet system is arranged in the housing for cooperation with the further measuring coil, which third permanent magnet system is provided with a first pair of permanent magnets positioned opposite one another on either side of the carrier for cooperation with one of the two winding halves of the further measuring coil, and a second pair of permanent magnets arranged opposite one another on either side of the carrier for cooperation with the other winding half of the further measuring coil, the first and the second pair of magnets of the third magnet system being arranged, as seen parallel to the damping direction, in a same sequence as the first and the second pair of magnets of the second magnet system and being magnetized in opposed directions with respect to the magnets of the second magnet system, while the amplifier during operation supplies the actuator coil with an electric current which is substantially equal to a product of a difference between the electric currents generated in the measuring coil and in the further measuring coil and the predetermined amplification factor.

7. A lithographic device provided with a radiation source, a mask holder, a focusing unit with a main axis, a positioning device with a substrate holder which is displaceable relative to the focusing unit parallel to an X-direction which is perpendicular to the main axis and parallel to a Y-direction which is perpendicular to the X-direction and perpendicular to the main axis, and a position measuring system for measuring a position occupied by the substrate holder with respect to the focusing unit parallel to the X-direction and parallel to the Y-direction, said focusing unit being fastened to a first holder, while the position measuring system is fastened to a second holder which is fastened to the first holder, wherein the lithographic device is provided with the motion damper as claimed in claim 1, the first part of the motion damper being fastened to one of the two holders, and the second part of the motion damper being fastened to the other holder.

* * * * *